United States Patent
Hirano et al.

(10) Patent No.: US 7,927,997 B2
(45) Date of Patent: Apr. 19, 2011

(54) FLIP-CHIP MOUNTING METHOD AND BUMP FORMATION METHOD

(75) Inventors: Koichi Hirano, Osaka (JP); Seiji Karashima, Osaka (JP); Takashi Ichiryu, Osaka (JP); Yoshihiro Tomita, Osaka (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 571 days.

(21) Appl. No.: 11/579,299

(22) PCT Filed: Mar. 7, 2006

(86) PCT No.: PCT/JP2006/304351
§ 371 (c)(1),
(2), (4) Date: Nov. 2, 2006

(87) PCT Pub. No.: WO2006/098187
PCT Pub. Date: Sep. 21, 2006

(65) Prior Publication Data
US 2007/0243664 A1 Oct. 18, 2007

(30) Foreign Application Priority Data
Mar. 15, 2005 (JP) .................................. 2005-072526

(51) Int. Cl.
*H01L 21/445* (2006.01)
(52) U.S. Cl. ........ 438/612; 438/108; 438/613; 438/678; 228/180.22; 257/738; 257/772; 257/778; 257/779; 257/E21.508
(58) Field of Classification Search .................. 257/737, 257/738, 772, 778, 779; 438/108, 612, 613, 438/614, 615, 616, 617, 678; 228/180.22
See application file for complete search history.

(56) References Cited

FOREIGN PATENT DOCUMENTS
GB 2389460 * 10/2003
(Continued)

OTHER PUBLICATIONS

Rito, M., et al. "Assembly Process by Electrically Conductive Adhesive Using Low Melting Point Fillers" 9th Symposium on 'Microjoining and Assembly Technology in Electronics' Feb. 6-7, 2003, Yokohama, pp. 115-120.

(Continued)

*Primary Examiner* — Wai-Sing Louie
*Assistant Examiner* — Eva Yan Montalvo
(74) *Attorney, Agent, or Firm* — McDermott Will & Emery LLP

(57) ABSTRACT

To provide a flip-chip mounting method and a bump formation method applicable to flip-chip mounting of a next generation LSI and having high productivity and high reliability. A semiconductor chip 20 having a plurality of electrode terminals 12 is held to oppose a circuit board 21 having a plurality of connection terminals 11 with a given gap provided therebetween, and the semiconductor chip 20 and the circuit board 21 in this state are dipped in a dipping bath 40 containing a melted resin 14 including melted solder particles for a given period of time. In this dipping process, the melted solder particles self-assemble between the connection terminals 11 of the circuit board 21 and the electrode terminals 12 of the semiconductor chip 20, so as to form connectors 22 between these terminals. Thereafter, the semiconductor chip 20 and the circuit board 21 are taken out of the dipping bath 40, and the melted resin 14 having permeated into the gap between the semiconductor chip 20 and the circuit board 21 is cured, so as to complete a flip-chip mounting body.

8 Claims, 8 Drawing Sheets

FOREIGN PATENT DOCUMENTS

| | | | |
|---|---|---|---|
| JP | 01-157796 | | 6/1989 |
| JP | 05-1881155 | * | 7/1993 |
| JP | 2000-094179 | | 4/2000 |
| JP | 2000-332055 | | 11/2000 |
| JP | 2004-260131 | | 9/2004 |

OTHER PUBLICATIONS

Yasuda, M., et al. "Self-Organized Joining Assembly Process by Electrically Conductive Adhesive Using Low Melting Point Fillers" 10th Symposium on 'Microjoining and Assembly Technology in Electronics' Feb. 5-6, 2004, Yokohama, pp. 183-188.

Yasuda, K., et al. "Self-Organized Packaging using Polymer Containing Low-Melting-Point-Metal Filler -Process Simulation of Viscous Multi Phase Flow Fluid-" 11th Symposium on 'Microjoining and Assembly Technology in Electronics' Feb. 3-4, 2005, Yokohama, pp. 239-244.

Yamada, T., et al. "Self-organized Packaging by Polymer Containing Low-Melting-Point-Metal—Experimental Verification of Process Rule Factors of Self-organization-" 11th Symposium on 'Microjoining and Assembly Technology in Electronics' Feb. 3-4, 2005, Yokohama, pp. 245-250.

* cited by examiner

FLIP-CHIP MOUNTING METHOD AND BUMP FORMATION METHOD

RELATED APPLICATIONS

This application is a national phase of PCT/JP2006/304351 filed on Mar. 7, 2006, which claims priority from Japanese Application No. 2005-072526 filed on Mar. 15, 2005, the disclosures of which Applications are incorporated by reference herein. The benefit of the filing and priority dates of the International and Japanese Applications is respectfully requested.

TECHNICAL FIELD

The present invention relates to a flip-chip mounting method for mounting a semiconductor chip on a circuit board and a method for forming a bump on an electrode of a substrate.

BACKGROUND ART

Recently, in accordance with the increased density and the increased degree of integration of semiconductor integrated circuits (LSIs) used in electronic equipment, the number of electrode terminals of an LSI chip has been rapidly increased and the pitch therebetween has been rapidly reduced. In mounting such an LSI chip on a circuit board, flip-chip mounting is widely employed for reducing interconnect delay. Generally, in the flip-chip mounting, solder bumps are formed on electrode terminals of an LSI chip and the electrode terminals of the LSI chip are connected as a whole to connection terminals formed on a circuit board through the solder bumps.

However, in order to mount a next generation LSI including electrode terminals in the number exceeding 5,000 on a circuit board, it is necessary to form bumps correspondingly to a fine pitch of 100 μm or less, but it is difficult to cope with this fine pitch by the current solder bump forming technology. Also, since bumps in the large number corresponding to the number of electrode terminals should be formed, in order to reduce the cost, it is desired to attain high productivity by reducing mounting tact time per chip.

Similarly, in accordance with the increased number of electrode terminals, the arrangement of electrode terminals of semiconductor integrated circuits has been changed to area array arrangement from peripheral arrangement. Furthermore, in order to meet the demands for a higher density and a higher degree of integration, the semiconductor process is expected to be developed from 90 nm process to 65 nm or 45 nm process. As a result, the refinement of interconnects is further proceeded, and the capacitance between interconnects is increased. Therefore, problems of a rapid operation and a power consumption loss have become serious, and there are increasing demands for reducing the dielectric constant (i.e., attaining low-k) of an insulating film provided between interconnect layers. The low-k of such an insulating film can be realized by making the material for the insulating film porous, and therefore, such a film is poor in the mechanical strength and hence is an obstacle to thickness reduction of a semiconductor. Moreover, in the case where electrode terminals are formed in the area array arrangement, since the porous film has a problem of the strength due to its low-k, it is difficult to form bumps on the electrode terminals in the area array arrangement and to perform the flip-chip mounting itself. Accordingly, there is a demand for a small-load flip-chip mounting method suitably employed for a thin and high-density semiconductor coping with the future development of the semiconductor process.

As a technique for forming bumps, a plating method or a screen printing method is conventionally developed. Although the plating method is suitable for attaining a fine pitch, the process is complicated and is disadvantageous in the productivity. Alternatively, the screen printing method is good at productivity but is not suitable for attaining a fine pitch because a mask is used.

Under these circumstances, some techniques for forming solder bumps on electrodes of an LSI chip or a circuit board have been recently developed. These techniques are not only suitable for forming fine bumps but also good at productivity because bumps can be formed as a whole, and hence are regarded to be applicable to the mounting of a next generation LSI on a circuit board.

For example, in a technique disclosed in Patent Document 1, solder paste made of a mixture of a solder powder and a flux is solidly applied on a substrate on which electrodes have been formed, and the solder powder is melted by annealing the substrate, so as to selectively form solder bumps on the electrodes with high wettability.

Alternatively, in a technique disclosed in Patent Document 2, a paste composition including an organic acid lead salt and metal tin as principal components (chemical reaction depositing solder) is solidly applied on a substrate on which electrodes have been formed, and a substitution reaction between Pb and Sn is caused by annealing the substrate, so as to selectively deposit Pb/Sn alloy on the electrodes of the substrate.

However, in both of the techniques disclosed in Patent Documents 1 and 2, the paste composition is supplied onto the substrate through application, and hence, variation in thickness and concentration is locally caused. Therefore, the amount of depositing solder is different among the electrodes, and hence, the bumps cannot be formed in a uniform height. Also, in these methods, since the paste composition is supplied by the application onto the irregular surface of the circuit board where the electrodes have been formed, a sufficient amount of solder cannot be supplied onto the electrodes corresponding to convex portions, and therefore, it is difficult to attain a desired height of bumps necessary for the flip-chip mounting.

In the flip-chip mounting employing the conventional bump formation method, after mounting a semiconductor chip on a circuit board where bumps have been formed, it is necessary to further perform a procedure for injecting a resin designated as an underfill resin into a space between the semiconductor chip and the circuit board for fixing the semiconductor chip on the circuit board.

Therefore, as a method for simultaneously obtaining electric connection between opposing electrode terminals of a semiconductor chip and a circuit board and fixing the semiconductor chip on the circuit board, a flip-chip mounting technique using an isotropic conducting material (see, for example, Patent Document 3) has been developed. In this method, a thermosetting resin including conducting particles is supplied between a circuit board and a semiconductor chip and a pressure is applied to the semiconductor chip at the same time as the thermosetting resin is annealed. Thus, the electric connection between the electrode terminals of the semiconductor chip and the circuit board and the fixation of the semiconductor chip on the circuit board can be simultaneously realized.

Patent Document 1: Japanese Laid-Open Patent Publication No. 2000-94179

Patent Document 2: Japanese Laid-Open Patent Publication No. 1-157796

Patent Document 3: Japanese Laid-Open Patent Publication No. 2000-332055

DISCLOSURE OF THE INVENTION

Problems to be Solved by the Invention

In the flip-chip mounting using an anisotropic conducting material, however, electric conductance between the electrodes is obtained by mechanical contact through the conducting particles, and therefore, it is difficult to obtain a stable conducting state.

Also, since the conducting particles sandwiched between the opposing electrodes are kept by cohesion obtained through the thermal curing of the resin, it is necessary to adjust the characteristics of the thermosetting resin such as the elastic coefficient and the coefficient of thermal expansion and the characteristics of the conducting particles such as the grain size distribution, and therefore, the process is disadvantageously difficult to control.

Specifically, the flip-chip mounting using an isotropic conducting material still has a large number of problems in the productivity and the reliability for the application to a next generation LSI chip having connection terminals in the number exceeding 5,000.

The present invention was devised in consideration of these conventional circumstances, and an object is providing a flip-chip mounting method with high productivity and high reliability applicable to flip-chip mounting of a next generation LSI. Another object is providing a bump formation method in which the technique of the flip-chip mounting method of the invention is applied to formation of bumps.

Means for Solving Problems

The flip-chip mounting method of this invention in which a semiconductor chip having a plurality of electrode terminals is aligned to oppose a circuit board having a plurality of connection terminals for electrically connecting the connection terminals of the circuit board and the electrode terminals of the semiconductor chip to each other, includes the steps of: holding the semiconductor chip to oppose the circuit board with a given gap provided therebetween; and dipping the semiconductor chip and the circuit board held with the given gap in a dipping bath containing a melted resin including melted solder particles, and in the step of dipping, the melted solder particles self-assemble between the connection terminals of the circuit board and the electrode terminals of the semiconductor chip, whereby forming connectors between the terminals.

The step of dipping is preferably performed while rocking the semiconductor chip and the circuit board held with the given gap within the dipping bath. Alternatively, the step of dipping is preferably performed while allowing the melted resin contained in the dipping bath to flow.

In one preferable aspect, the flip-chip mounting method further includes, after the step of dipping, a step of taking the semiconductor chip and the circuit board out of the dipping bath and curing the melted resin having permeated into the gap between the semiconductor chip and the circuit board.

In one preferable aspect, in the step of holding the semiconductor chip, the semiconductor chip is held to oppose the circuit board with the given gap provided therebetween by holding the semiconductor chip and the circuit board with a fixing jig.

Furthermore, the step of holding the semiconductor chip includes a step of holding a plurality of semiconductor chips and a plurality of circuit boards with the fixing jig, whereby holding each of the semiconductor chips to oppose each of the circuit boards with a given gap provided therebetween, and the step of dipping is performed as batch processing for dipping the plurality of semiconductor chips and the plurality of circuit boards simultaneously in the dipping bath.

The step of dipping is preferably performed with a pressure in the dipping bath reduced.

In one preferable aspect, the step of dipping is performed in a dipping bath in which the melted resin has a temperature gradient, and the solder particles included in the melted resin are kept in an unmelted state in a low temperature region and are kept in a melted state in a high temperature region, and the semiconductor chip and the circuit board held with the given gap are dipped in the low temperature region of the dipping bath for a given period of time before being dipped in the high temperature region for a given period of time.

The bump formation method of this invention for forming bumps on electrodes of a substrate having a plurality of electrodes, includes the steps of holding a flat plate to oppose the substrate with a given gap provided therebetween; and dipping the substrate and the flat plate held with the given gap in a dipping bath containing a melted resin including melted solder particles, and in the step of dipping, the melted solder particles self-assemble on the electrodes of the substrate, whereby forming bumps on the electrodes.

In one preferable aspect, the bump formation method further includes, after the step of dipping, a step of taking the substrate and the flat plate out of the dipping bath and removing the flat plate and the melted resin having permeated into the gap between the substrate and the flat plate.

A plurality of metal patterns in substantially the same shape as the electrodes are preferably formed on the flat plate in positions opposing the plurality of electrodes formed on the substrate.

Furthermore, the substrate is preferably a circuit board, a semiconductor chip or a semiconductor wafer.

The mounting apparatus of this invention for flip-chip mounting a semiconductor chip on a circuit board, includes a fixing jig for holding the semiconductor chip and the circuit board with a given gap provided therebetween; a dipping bath containing a melted resin including melted solder particles; and a conveyor for conveying the fixing jig into the dipping bath, and the fixing jig holding the semiconductor chip and the circuit board is dipped in the dipping bath by the conveyor and the melted solder particles are made to self-assemble between connection terminals of the circuit board and electrode terminals of the semiconductor chip, whereby forming connectors between the terminals.

The other mounting apparatus of this invention for forming bumps on electrodes of a substrate having a plurality of electrodes, includes a fixing jig for holding a flat plate in a position to oppose the substrate with a given gap provided therebetween; a dipping bath containing a melted resin including melted solder particles; and a conveyor for conveying the fixing jig into the dipping bath, and the fixing jig holding the substrate and the flat plate is dipped in the dipping bath by the conveyor and the melted solder particles are made to self-assemble on the electrodes of the substrate, whereby forming bumps on the electrodes.

The conveyor preferably includes means for causing rocking movement within the dipping bath. Alternatively, the dipping bath preferably includes means for allowing the melted resin to flow in the dipping bath.

In one preferable aspect, the mounting apparatus further includes annealing means, and the fixing jig holding the semiconductor chip and the circuit board or the substrate and the flat plate is taken out of the dipping bath and is transferred to the annealing means, whereby thermally curing the melted resin having permeated into the gap between the semiconductor chip and the circuit board or between the substrate and the flat plate.

The fixing jig is preferably able to hold a plurality of pairs of the semiconductor chip and the circuit board or the substrate and the flat plate.

In one preferable aspect, the mounting apparatus further includes a particle counter, and the number or grain size of the melted solder particles included in the melted resin is measured with the particle counter for controlling quality of the dipping bath.

In one preferable aspect, the dipping bath is connected to a circulating apparatus for circulating the melted resin including the melted solder particles, and the melted solder particles included in the melted resin contained in the dipping bath is kept in a given ratio by making the melted resin including the melted solder particles circulate between the dipping bath and the circulating apparatus.

The other flip-chip mounting method of this invention in which a circuit board having a plurality of connection terminals is aligned to oppose a semiconductor chip having a plurality of electrode terminals for electrically connecting the connection terminals of the circuit board and the electrode terminals of the semiconductor chip to each other, includes the steps of holding the semiconductor chip to oppose the circuit board with a given gap provided therebetween; dipping the semiconductor chip and the circuit board held with the given gap in a dipping bath containing a melted resin including solder particles and a convection additive for a given period of time; and annealing the melted resin having permeated into the gap between the semiconductor chip and the circuit board after taking the semiconductor chip and the circuit board out of the dipping bath, and in the step of annealing, the solder particles are melted and the convection additive is boiled to convect within the melted resin for making the melted solder particles self-assemble between the connection terminals of the circuit board and the electrode terminals of the semiconductor chip, whereby forming connectors between the terminals.

In one preferable aspect, the flip-chip mounting method further includes, after the step of annealing, a step of fixing the semiconductor chip on the circuit board by curing the melted resin having permeated into the gap between the semiconductor chip and the circuit board.

The other bump formation method of this invention for forming bumps on electrodes of a substrate having a plurality of electrodes, includes the steps of holding a flat plate in a position to oppose the substrate with a given gap provided therebetween; dipping the substrate and the flat plate held with the given gap in a dipping bath containing a melted resin including solder particles and a convection additive for a given period of time; and annealing the melted resin having permeated into the gap between the substrate and the flat plate after taking the substrate and the flat plate out of the dipping bath, and in the step of annealing, the solder particles are melted and the convection additive is boiled to convect within the melted resin for making the melted solder particles self-assemble on the electrodes of the substrate, whereby forming bumps on the electrodes.

EFFECTS OF THE INVENTION

In the flip-chip mounting method of this invention, a semiconductor chip and a circuit board held with a given gap provided therebetween are dipped in a dipping bath containing a melted resin including melted solder particles, so that the melted solder particles dispersed in the melted resin can be constantly supplied to the gap between the semiconductor chip and the circuit board. Therefore, bond of the melted solder particles is uniformly proceeded in the gap. As a result, the melted solder particles uniformly grown self-assemble between connection terminals of the circuit board and electrode terminals of the semiconductor chip with high wettability, and hence, connectors for electrically connecting the electrode terminals and the connection terminals to each other can be uniformly formed.

Furthermore, when the semiconductor chip and the circuit board held with the given gap are dipped while being rocked in the dipping bath or while allowing the melted resin contained in the dipping bath to flow, the melted solder particles dispersed in the melted resin can be more forcedly supplied to the gap between the semiconductor chip and the circuit board, and hence, the bond of the melted solder particles can be uniformly proceeded in a balanced manner. As a result, more uniform connectors can be formed between the electrode terminals and the connection terminals. In addition, since the melted solder particles dispersed in the melted resin can be efficiently incorporated into the gap, the ratio of the melted solder particles to be included in the melted resin can be set to be small, and hence, quality control of the dipping bath can be easily performed.

Moreover, after forming the connectors between the terminals of the circuit board and the semiconductor chip in the dipping bath, the circuit board and the semiconductor chip are taken out of the dipping bath and the melted resin having permeated into the gap between the circuit board and the semiconductor chip is cured. Thus, electric connection between the semiconductor chip and the circuit board and fixation of the semiconductor chip on the circuit board can be both performed through a series of procedures, and therefore, flip-chip mounting with high productivity can be realized.

Figure 1A:
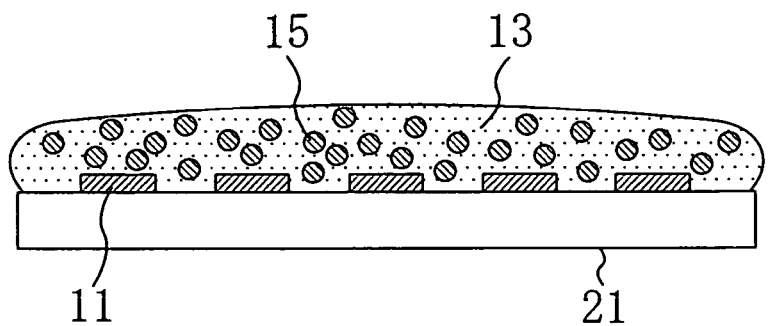
FIGS. 1A through 1C are cross-sectional views for showing procedures in a flip-chip mounting method using a resin including a convection additive.

DESCRIPTION OF REFERENCE NUMERALS 10 circuit board
11 connection terminal
12 electrode terminal
13, 14 resin
15 convection additive
20 semiconductor chip
21 circuit board
22 connector
25 substrate
26 flat plate
27 electrode
28 bump
30, 31 fixing jig
40, 40a, 40b dipping bath
50 mounting apparatus
60 conveyor
70 annealing means
80 particle counter
90 circulating apparatus
91, 92 connecting pipe

BEST MODE FOR CARRYING OUT THE INVENTION

The present applicant has examined flip-chip mounting applicable to a next generation LSI chip and proposed a novel flip-chip mounting method in which fine bumps can be uniformly formed in Japanese Patent Application No. 2004-267919.

Figure 1B:
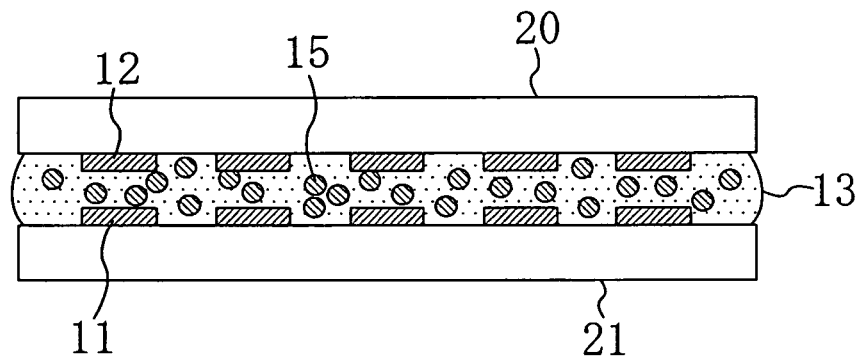
Figure 1C:
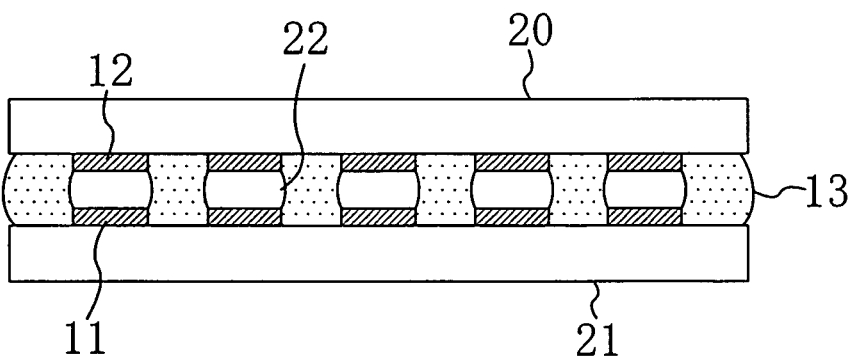

FIGS. 1A through 1C are diagrams for showing basic procedures in the flip-chip mounting method disclosed in the description of the patent application by the present applicant.

First, as shown in FIG. 1A, a resin 13 including solder particles (not shown) and an additive 15 is supplied onto a circuit board 21 where a plurality of connection terminals 11 are formed.

Next, as shown in FIG. 1B, the surface of the resin 13 supplied onto the circuit board 21 is brought into contact with a semiconductor chip 20. At this point, the semiconductor chip 20 having a plurality of electrode terminals 12 are aligned to oppose the circuit board 21 having the plural connection terminals 11. Under this condition, the resin 13 is annealed, so as to melt the solder particles dispersed in the resin 13.

The melted solder particles are bonded to one another within the resin 13 as shown in FIG. 1C and self-assemble between the connection terminals 11 and the electrode terminals 12 with high wettability, so as to form connectors 22. Ultimately, the resin 13 is cured so as to fix the semiconductor chip 20 on the circuit board 21, and thus, a flip-chip mounting body is completed.

This method is characterized by that the resin 13 including the solder particles further includes the additive 15 boiled at a temperature where the solder particles are melted. Specifically, at the temperature where the solder particles are melted, the additive 15 included in the resin 13 (hereinafter referred to as the convection additive) is boiled and is convected within the resin 13, so as to accelerate the movement of the melted solder particles dispersed within the resin 13, which proceeds uniform bond of the melted solder particles. As a result, the melted solder particles uniformly grown self-assemble between the connection terminals 11 of the circuit board 21 and the electrode terminals 12 of the semiconductor chip 20 with high wettability, so that the connectors 22 with high uniformity can be formed between the connection terminals 11 and the electrode terminals 12.

It can be regarded that the resin 13 including the solder particles works as a "sea" where the melted solder particles can freely float and move. However, since the bonding process of the melted solder particles is completed in a very short period of time, even when the "sea" where the melted solder particles can move is provided, the bond is proceeded merely locally and it is difficult to uniformly bond the melted solder particles to one another.

In other words, in the above-described method, means for forcedly moving the melted solder particles is additionally provided by further including the convection additive 15 in the resin 13 including the solder particles.

The convection additive 15 may be any additive as far as it is boiled when the resin 13 is annealed at the temperature where the solder particles are melted, and for example, isopropyl alcohol, butyl acetate, butyl Carbitol, ethylene glycol or the like can be used in accordance with the melting point of the used solder particles.

The present invention is based on a similar technical point of view, and melted solder particles are made to efficiently self-assemble between terminals by a method different from that described above, so as to provide a novel flip-chip mounting method for realizing formation of uniform connectors.

Preferred embodiments of the invention will now be described with reference to the accompanying drawings. In the drawings referred to below, like reference numerals are used to refer to like elements having substantially the same function for simplifying the description. It is noted that the present invention is not limited to the embodiments described below.

Embodiment 1

FIGS. 2a through 2d are cross-sectional views for showing basic procedures in a flip-chip mounting method according to Embodiment 1 of the invention.

Figure 2A:
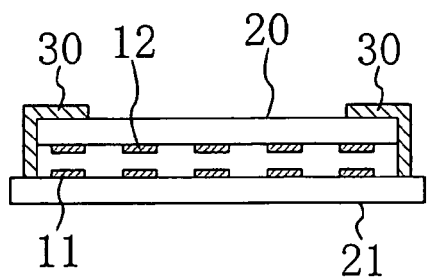
FIGS. 2A through 2D are cross-sectional views for showing procedures in a flip-chip mounting method according to Embodiment 1 of the invention.

First, as shown in FIG. 2A, a semiconductor chip 20 having a plurality of electrode terminals 12 is held by a fixing jig 30 so as to oppose a circuit board 21 having a plurality of connection terminals 11 with a given gap (of, for example, 10 through 100 μm) provided therebetween. At this point, the electrode terminals 12 of the semiconductor chip 20 and the connection terminals 11 of the circuit board 10 are aligned to oppose each other.

At this point, the fixing jig 30 may be anything as far as it can fix the semiconductor chip 20 and the circuit board 21 with the given gap provided therebetween, and a spacer may be inserted between the semiconductor chip 20 and the circuit board 21 for keeping the given gap.

Figure 2B:
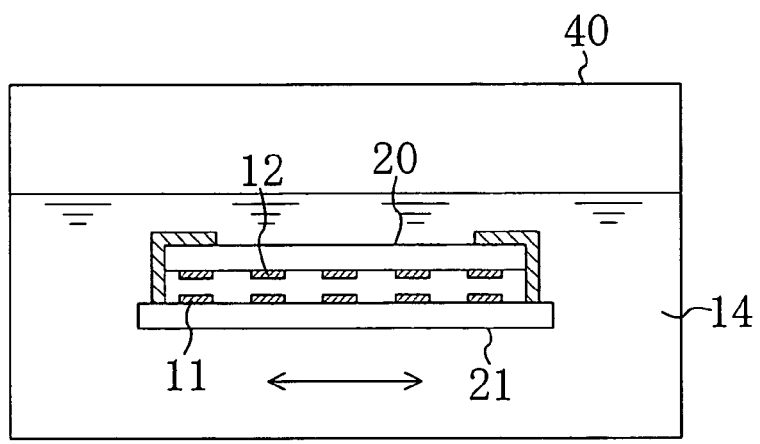

Next, as shown in FIG. 2B, the semiconductor chip 20 and the circuit board 21 held with the given gap are dipped in a dipping bath 40 containing a melted resin (such as epoxy resin) 14 including melted solder particles (such as Sn—Ag-based solder) for a given period of time. At this point, the melted resin 14 permeates into the gap between the semiconductor chip 20 and the circuit board 21, and the gap is filled with the melted resin 14. It is noted that the dipping bath 40 is kept at a temperature where the solder particles are melted (for example, 150 through 250° C.).

Figure 2C:
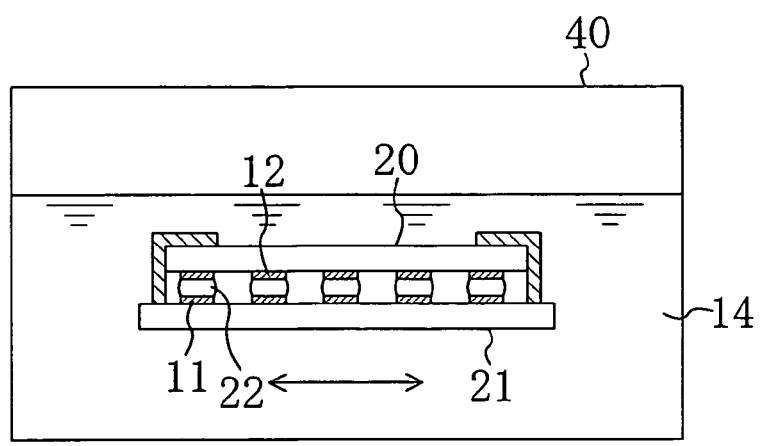

In this dipping process, the melted solder particles dispersed within the resin 14 self-assemble between the connection terminals 11 and the electrode terminals 12 with high wettability, so as to form connectors 22 between the terminals as shown in FIG. 2C. It is noted that the dipping time is typically preferably approximately 5 through 60 seconds depending upon the amount of melted solder particles dispersed in the melted resin 14.

At this point, since the melted resin 14 can freely permeate into the gap between the semiconductor chip 20 and the circuit board 21 dipped in the dipping bath 40, the melted solder particles dispersed in the melted resin 14 are constantly supplied to the gap between the semiconductor chip 20 and the circuit board 21 as a result, and hence, the bond of the melted solder particles can be uniformly proceeded in the gap.

When the semiconductor chip 20 and the circuit board 21 held with the given gap are dipped in the dipping bath 40 while being rocked in the direction of an arrow shown in FIGS. 2B and 2C, the melted solder particles dispersed in the melted resin 14 can be more forcedly supplied to the gap between the semiconductor chip and the circuit board, resulting in proceeding the bond of the melted solder particles more uniformly. Also, the same effect can be attained by dipping them while allowing the melted resin contained in the dipping bath to flow.

Figure 2D:
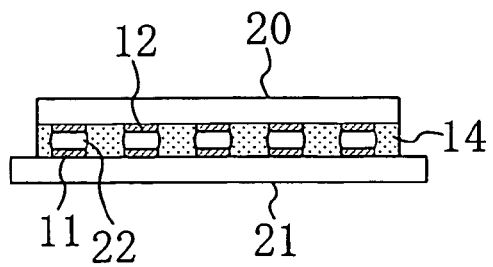

Next, after forming the connectors 22, as shown in FIG. 2D, the semiconductor chip 20 and the circuit board 21 are taken out of the dipping bath 40, and the melted resin 14 having permeated into the gap between the semiconductor chip 20 and the circuit board 21 is cured, so as to fix the semiconductor chip 20 on the circuit board 21, and thus, a flip-chip mounting body is completed.

Since the gap between the semiconductor chip 20 and the circuit board 21 is so small to the extent that the connectors 22 can be formed (and is typically, 10 through 80 μm), even after taking the semiconductor chip 20 and the circuit board 21 out of the dipping bath 40, the melted resin 14 having permeated into the gap stays in the gap and does not flow out because it has given viscosity.

According to the present invention, the melted solder particles dispersed in the melted resin 14 are constantly supplied to the gap between the semiconductor chip 20 and the circuit board 21 by dipping the semiconductor chip 20 and the circuit board 21 held with the given gap in the dipping bath 40 containing the melted resin 14 including the melted solder particles. Therefore, the bond of the melted solder particles can be uniformly proceeded in the gap. Accordingly, the melted solder particles uniformly grown self-assemble between the connection terminals of the circuit board and the electrode terminals of the semiconductor chip with high wettability, so as to uniformly form the connectors for electrically connecting the terminals to each other.

Furthermore, when the semiconductor chip 20 and the circuit board 21 held with the given gap are dipped in the dipping bath 40 while being rocked, or when they are dipped while allowing the melted resin 14 to flow in the dipping bath 40, the melted solder particles dispersed in the melted resin 14 can be more forcedly supplied to the gap between the semiconductor chip 20 and the circuit board 21, and hence, the bond of the melted solder particles can be more uniformly proceeded. As a result, the connectors can be more uniformly formed between the terminals of the semiconductor chip 20 and the circuit board 21.

The melted resin 14 contained in the dipping bath 40 includes the melted solder particles in a given ratio, and the melted solder particles are supplied for forming the connectors 22 for connecting the terminals of the semiconductor chip 20 and the circuit board 21, and therefore, the melted resin 14 should include the solder particles at least in the amount sufficient for forming the connectors 22.

If the melted resin 14 including the solder particles is supplied onto a limited area on the surface of the circuit board 21 (or the semiconductor chip 20) by the method shown in FIG. 1A, the minimum amount of solder particles to be included in the melted resin 14 is equivalent to the ratio of all the connection terminals 11 (or the electrode terminals 12) occupied on the surface of the circuit board 21 (or the semiconductor chip 20). This amount depends upon the arrangement of the connection terminals 11, and for example, when an area array is assumed to be employed, the melted resin 14 should include 15 through 30 vol % of solder particles.

On the contrary, in the method of this invention in which the semiconductor chip 20 and the circuit board 21 are dipped in the dipping bath 40 containing the melted resin 14, the solder particles dispersed in the melted resin 14 can be incorporated into the gap between the semiconductor chip 20 and the circuit board 21 at any time, and therefore, the ratio of the melted solder particles to be included in the melted resin 14 can be much smaller than in the method shown in FIG. 1A.

In particular, when the semiconductor chip 20 and the circuit board 21 are rocked within the dipping bath 40 or the melted resin 14 is allowed to flow within the dipping bath 40 in the dipping process, the melted solder particles can be more smoothly incorporated into the gap, and hence, the aforementioned effect can be more remarkably exhibited.

The dipping process may be performed with the pressure within the dipping bath reduced. When the pressure is reduced, bubbles can be suppressed within the melted resin and the melted solder particles can be more smoothly incorporated into the gap, and therefore, the aforementioned effect can be more remarkably exhibited.

The ratio of the melted solder particles to be included in the melted resin 14 in this invention, which depends upon the size of the dipping bath 40, is 3 through 6 vol % in the aforementioned exemplified case of employing the area array, and can be reduced to approximately ⅕ or less as compared with the method shown in FIG. 1A.

This is significant for quality control of the dipping bath 40 in this invention. Specifically, the melted solder particles dispersed in the melted resin 14 are bonded to one another when they come close to one another, but when the bond is repeated, the particles may be grown into a large solder ball. When the grown solder ball becomes as large as the gap between the semiconductor chip 20 and the circuit board 21, the melted resin 14 cannot be used any more. When the ratio of the melted solder particles to be included in the melted resin 14 is set as small as possible, however, the dipping bath 40 can be kept in a stable state for a long period of time.

Furthermore, after forming the connectors 22 between the terminals of the circuit board 21 and the semiconductor chip 20 in the dipping bath 40, the circuit board 21 and the semiconductor chip 20 are taken out of the dipping bath 40, and the melted resin 14 having permeated into the gap between the circuit board 21 and the semiconductor chip 20 is cured. Thus, electrical connection between the terminals of the semiconductor chip 20 and the circuit board 21 and the fixation of the semiconductor chip 20 on the circuit board 21 can be continuously performed through a series of procedures, and hence, it is possible to realize flip-chip mounting with high productivity.

Materials applied in the flip-chip mounting method of this invention are not particularly specified, and typical examples are as follows:

First, the melted resin 14 is preferably a resin that is in the form of a liquid or has lower viscosity at the temperature at which the solder particles are melted. For example, as a thermosetting resin in the form of a liquid at the temperature where the solder particles are melted, an epoxy resin, a polyimide resin, a polyphenylene ether resin, a phenol resin, a fluororesin, an isocyanate resin or the like can be used. Alternatively, as a thermosetting resin having lower viscosity at the melting temperature, all aromatic polyesters, a fluororesin, a polyphenylene oxide resin, a syndiotactic polystyrene resin, a polyimide resin, a polyamide resin, an aramid resin, a polyphenylene sulfide in or the like can be used.

As the solder particles, a Sn—Ag-based, a Sn—Zn-based or a Sn—Bi-based solder can be used. Also, the grain size of the solder particles in an unmelted state is preferably approximately 2 through 30 µm.

Furthermore, the semiconductor chip 20 is not limited to a silicon semiconductor but may be a silicon-germanium semiconductor or a compound semiconductor such as a gallium arsenide semiconductor. In particular, when the method of this invention where small load is applied to the semiconductor chip is applied to a thin silicon semiconductor, a silicon-germanium semiconductor or a compound semiconductor with small mechanical strength, a flip-chip mounting body with high reliability can be realized.

Also, the method of this invention can be applied in the case where a semiconductor chip 20 built on an interposer is flip-chip mounted on a circuit board 21 instead of directly flip-chip mounting the semiconductor chip 20 on the circuit board 21.

Figure 3:
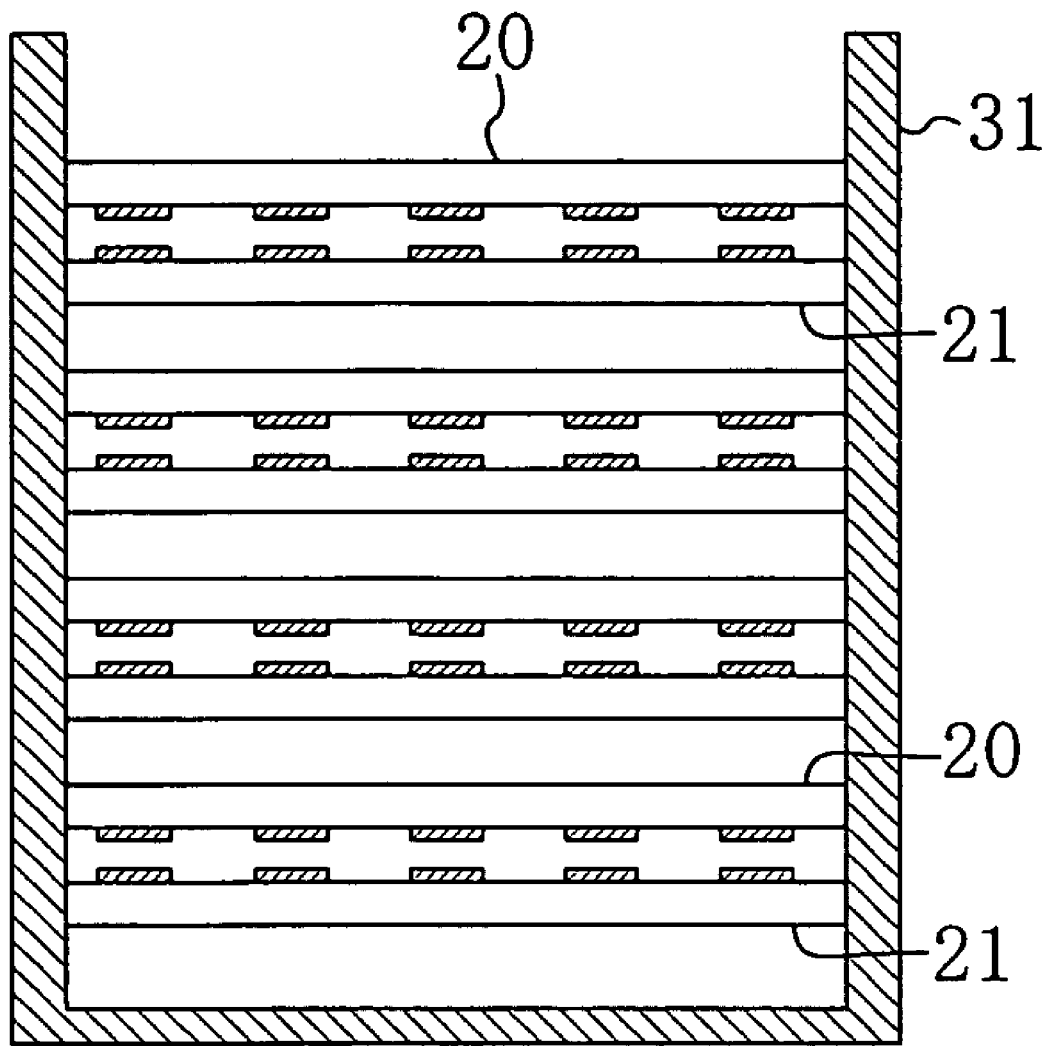
FIG. 3 is a cross-sectional view for showing the structure of a fixing jig used in Embodiment 1 of the invention.

The flip-chip mounting method of this invention is suitable also for batch processing. For example, as shown in FIG. 3, a plurality of semiconductor chips 20 and circuit boards 21 respectively opposing each other with a given gap provided therebetween are held on a fixing jig 31, and under this condition, the plural semiconductor chips 20 and circuit boards 21 are simultaneously dipped in the dipping bath 40. Thus, the dipping process can be performed as the batch processing.

For the batch processing, it is necessary to prepare a dipping bath 40 with a large size to some extent, but on the contrary, the content of the melted solder particles in the melted resin 14 can be further reduced, and hence, the dipping bath 40 can be more easily controlled. Furthermore, when the batch processing is employed, the throughput is increased, and the cost may be lowered in mass production process.

Figure 4:
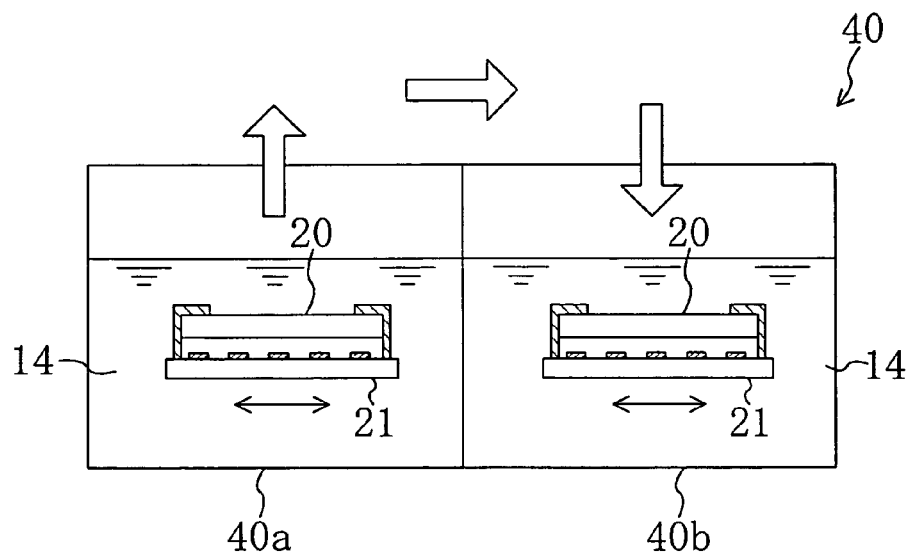
FIG. 4 is a cross-sectional view for showing an aspect of a dipping bath used in Embodiment 1 of the invention.

Moreover, in order to use the dipping bath 40 more stably, the dipping bath 40 may have a structure as shown in FIG. 4 or 5.

A dipping bath 40 shown in FIG. 4 includes two baths, that is, a first dipping bath 40a and a second dipping bath 40b. The solder particles included in the melted resin 14 contained in the first dipping bath 40a are controlled to be unmelted, and the solder particles included in the melted resin 14 contained in the second dipping bath 40b are controlled to be melted. In the case where, for example, Sn—Ag3.0-Cu0.5 (with a melting point of 221° C.) is used as the solder particles, the first dipping bath 40a is controlled in a range from room temperature to 200° C. and the second dipping bath 40b is controlled in a range from 230 to 250° C.

In the dipping process, the semiconductor chip 20 and the circuit board 21 fixed by the fixing jig are dipped in the first dipping bath 40a first, and after a predetermined time, they are taken out of the first dipping bath 40a and subsequently dipped in the second dipping bath 40b for a given period of time.

At this point, the dipping process performed in the second dipping bath 40b corresponds to the dipping process shown in FIGS. 2B and 2C, and the dipping process performed in the first dipping bath 40a is regarded as preliminary process for it. Specifically, the content of the dipping bath 40 (or 40b) containing the melted solder particles is preferably not too large for stabilizing the melted solder particles by preventing their aggregation and for reducing the energy consumed in keeping the melted state. On the other hand, when the content of the dipping bath 40 is small, the change in proportion of the solder particles in the melted resin 14 caused through the consumption of the melted solder particles in the formation of the connectors 22 is so large that it is difficult to keep the dipping bath 40 stable. Therefore, in order to make small the proportion change of the solder particles in the melted resin while preventing the aggregation of the melted solder particles, the preliminary dipping process is preferably performed in the dipping bath 40a containing the unmelted solder particles.

Figure 5A:
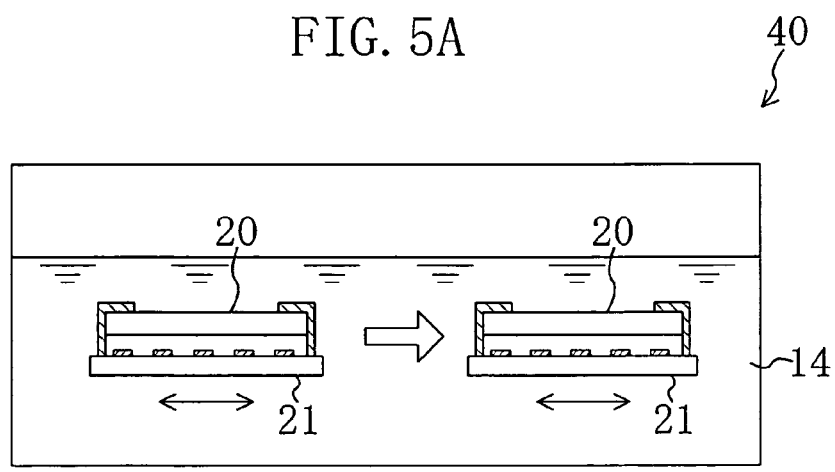
FIGS. 5A and 5B are cross-sectional views for showing an aspect of the dipping bath used in Embodiment 1 of the invention.
Figure 5B:
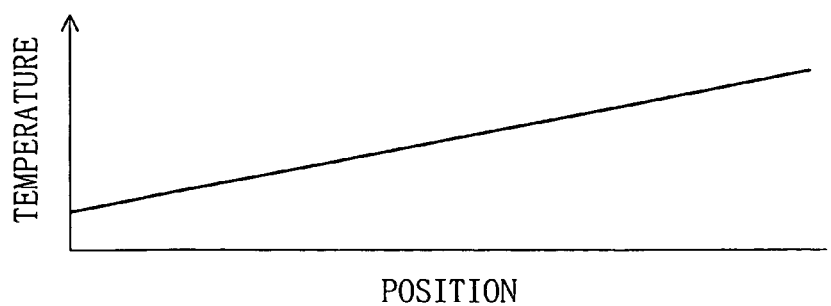

Next, a dipping bath 40 shown in FIG. 5A is controlled in such a manner that the melted resin 14 contained in the dipping bath 40 has a temperature gradient as shown in FIG. 5B. At this point, the solder particles included in the melted resin 14 are kept in an unmelted state in a low temperature region and in a melted state in a high temperature region. In the case where, for example, Sn—Ag3.0-Cu0.5 (with a melting point of 221° C.) is used as the solder particles, the melted resin 14 contained in the dipping bath 40 is controlled to have a temperature gradient from room temperature to 250° C.

As shown in FIG. 5A, the dipping process is executed by dipping the semiconductor chip 20 and the circuit board 21 held with the given gap in the low temperature region of the dipping bath 40 for a given period of time, moving them to the high temperature region and successively dipping them for a given period of time. The dipping process performed in the low temperature region corresponds to the preliminary process shown in FIG. 4, and the dipping process performed in the high temperature region corresponds to the dipping process shown in FIGS. 2B and 2C.

Embodiment 2

In the flip-chip mounting method described in Embodiment 1, a circuit board and a semiconductor chip are dipped in a dipping bath containing a melted resin including melted solder particles for a given period of time, so as to make the melted solder particles self-assemble between terminals of the circuit board and the semiconductor chip for forming connectors. This technique is also applicable to a bump formation method.

FIGS. 6A through 6D are cross-sectional views for showing basic procedures in a bump formation method according to Embodiment 2 of the invention. It is noted that detailed description of procedures commonly performed in the flip-chip mounting method shown in FIGS. 2A through 2D is omitted.

Figure 6A:
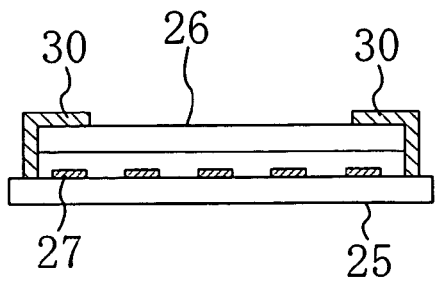
FIGS. 6A through 6D are cross-sectional views for showing procedures in a bump formation method according to Embodiment 2 of the invention.

First, as shown in FIG. 6A, a substrate 25 having a plurality of electrodes 27 is held by a fixing jig 30 so as to oppose a flat plate 26 with a given gap (of, for example, 10 through 100 µm) provided therebetween.

Figure 6B:
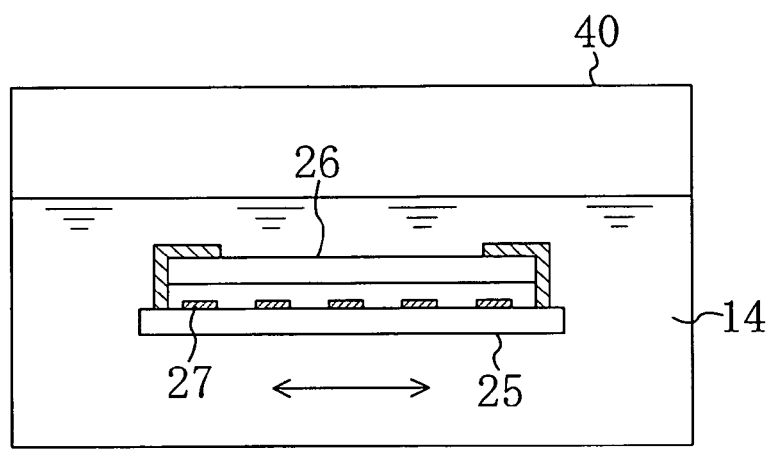

Next, as shown in FIG. 6B, the substrate 25 and the flat plate 26 held with the given gap are dipped for a given period of time in a dipping bath 40 containing a melted resin (such as epoxy resin) 14 including melted solder particles (of, for example, Sn—Ag-based solder). At this point, the melted resin 14 permeates into the gap between the substrate 25 and the flat plate 26, and the gap is filled with the melted resin 14. In this dipping process, the melted solder particles dispersed in the melted resin 14 self-assemble on the electrodes 27 with high wettability, so as to form bumps 28 on the electrodes 27 as shown in FIG. 2C. It is noted that the dipping time depends upon the amount of the melted solder particles dispersed in the melted resin 14 and is typically preferably 5 through 60 seconds.

At this point, since the melted resin 14 can freely permeate into the gap between the substrate 25 and the flat plate 26 dipped in the dipping bath 40, the melted solder particles dispersed in the melted resin 14 are constantly supplied to the gap between the substrate 25 and the flat plate 26, and hence, the bond of the melted solder particles can be uniformly proceeded in the gap.

Figure 6C:
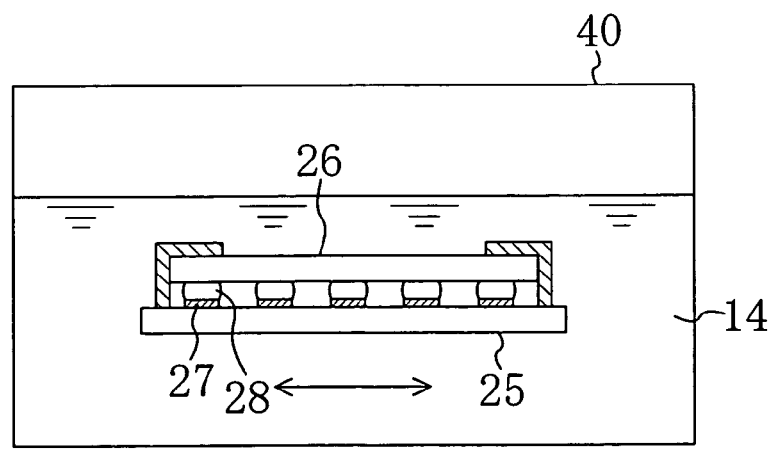

When the substrate 25 and the flat plate 26 held with the given gap are dipped while being rocked in the dipping bath 40 in a direction shown with an arrow in FIGS. 6B and 6C, the melted solder particles dispersed in the melted resin 14 can be more forcedly supplied to the gap between the substrate 25 and the flat plate 26, and as a result, the bond of the melted solder particles can be more uniformly proceeded. Alternatively, the same effect can be attained by dipping them while allowing the melted resin to flow in the dipping bath.

Figure 6D:
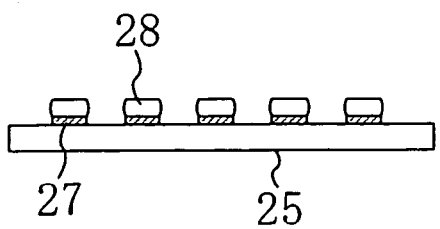

Next, after forming the bumps, as shown in FIG. 6D, the substrate 25 and the flat plate 26 are taken out of the dipping bath 40, and the melted resin 14 having permeated into the gap between the substrate 25 and the flat plate 26 and the flat plate are removed, and thus, the substrate 25 including the bumps formed on the electrodes 27 is completed. It is noted that the melted resin 14 can be removed with an organic solvent such as isopropyl alcohol.

At this point, the flat plate 26 may have a plurality of metal patterns in substantially the same shape as the electrodes 27 previously formed in positions opposing the plural electrodes 27 formed on the substrate 25. In this case, the procedures shown in FIGS. 6A through 6C are substantially the same as the flip-chip mounting procedures shown in FIGS. 2A through 2C. Since the metal patterns have high wettability with the melted solder particles, the self-assemble of the melted solder particles on the electrodes 27 can be more uniformly proceeded as compared with the case where the flat plate 26 has no metal patterns.

The material for the substrate 25 is not particularly specified, but the method is preferably applied to a circuit board, a semiconductor chip or a semiconductor wafer. In the application to a semiconductor chip, a bump-formed semiconductor chip obtained by the bump formation method of this invention is used in general flip-chip mounting process to be flip-chip mounted on a circuit board.

Embodiment 3

Figure 7:
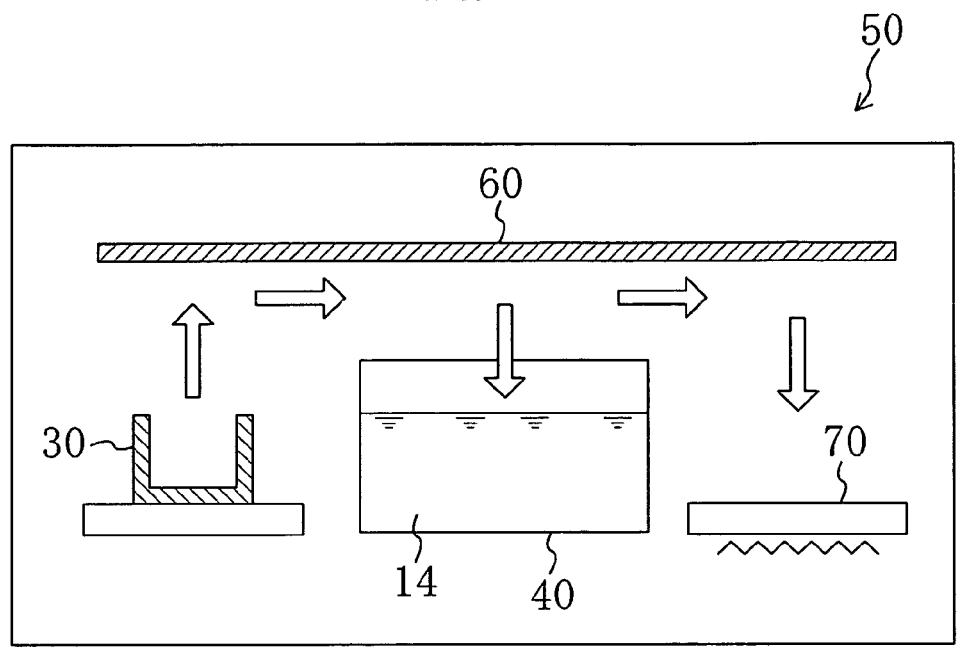
FIG. 7 is a diagram for showing the structure of a mounting apparatus according to Embodiment 3 of the invention.
Figure 8:
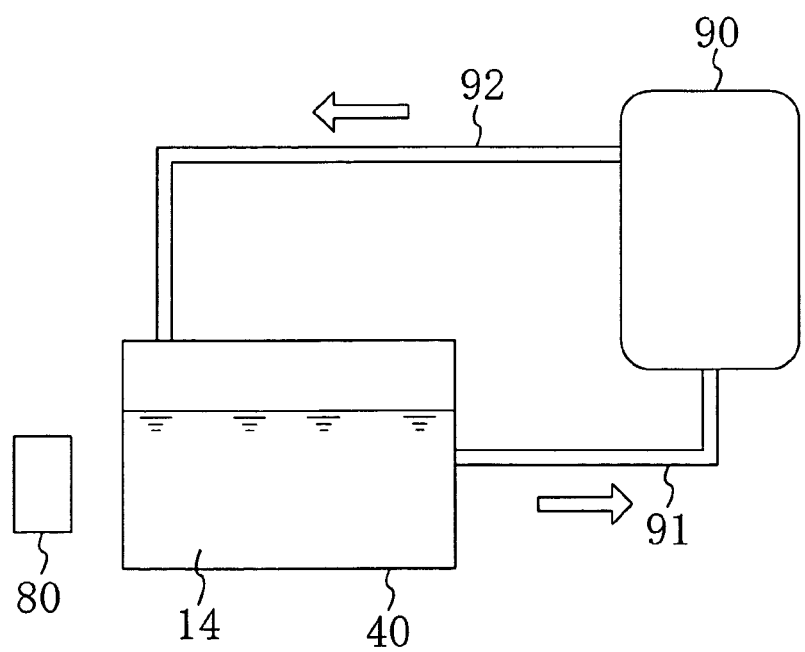
FIG. 8 is a diagram for showing the structure of a dipping bath used in Embodiment 3 of the invention.

FIGS. 7 and 8 are diagrams of a mounting apparatus 50 used for executing the flip-chip mounting method of this invention.

The mounting apparatus 50 shown in FIG. 7 includes a fixing jig 30 for holding a semiconductor chip (not shown) and a circuit board (not shown) to oppose each other with a given gap provided therebetween, a dipping bath 40 containing a melted resin 14 including melted solder particles, and a conveyor 60 for conveying the fixing jig 30 into the dipping bath 40, and further includes annealing means 70 if necessary.

In this mounting apparatus 50, the fixing jig 30 holding the semiconductor chip and the circuit board is dipped in the dipping bath 40 by using the conveyor 60, so as to make the melted solder particles contained in the dipping bath 40 self-assemble between connection terminals of the circuit board and electrode terminals of the semiconductor chip, and thus, connectors are formed between these terminals.

The semiconductor chip and the circuit board on which the connectors have been formed are taken out of the dipping bath 40 together with the fixing jig 30 by the conveyor 60, and are further transferred to the annealing means 70, in which the melted resin 14 having permeated into the gap between the semiconductor chip and the circuit board is thermally cured so as to complete a flip-chip mounting body.

The conveyor 60 is provided with a mechanism for rocking the fixing jig 30 within the dipping bath 40 while dipping the fixing jig 30 in the dipping bath 40, and the fixing jig 30 holding the semiconductor chip and the circuit board can be rocked within the dipping bath 40 by operating this mechanism. It is noted that to "rock" includes vertical movement, horizontal movement and their combination and also includes both periodic movement and aperiodic movement.

Furthermore, the dipping bath 40 includes a mechanism for allowing the melted resin 14 contained in the dipping bath 40 to flow. The "flow" of the melted resin 14 caused by such a mechanism is, for example, waving movement and includes both periodic movement and aperiodic movement.

As the annealing means 70, a heating stage (hot plate), a heating box (oven) heated by hot air or infrared, or the like can be used.

When the fixing jig 30 has a mechanism for holding a plurality of pairs of semiconductor chips and circuit boards, the apparatus can cope with the batch processing.

FIG. 8 shows a mechanism provided for keeping a constant state of the melted resin 14 in the dipping bath 40.

As shown in FIG. 8, a particle counter 80 is provided on a side of the dipping bath 40. The number or grain size of the melted solder particles (not shown) included in the melted resin 14 contained in the dipping bath 40 can be measured by the particle counter 80.

Since the melted solder particles included in the melted resin 14 are bonded to one another with time to grow into larger solder balls, it is a significant control item to monitor the grain size and the distribution of the melted solder particles contained in the dipping bath 40 for executing the flip-chip mounting of this invention. When the grain size distribution of the melted solder particles is periodically measured with the particle counter 80, the flip-chip mounting can be stably executed.

Furthermore, the melted solder particles are consumed in forming the connectors every time the dipping process is performed in the dipping bath 40, and therefore, the amount of the melted solder particles included in the melted resin 14 is gradually reduced. Accordingly, when the number of melted solder particles is periodically measured with the particle counter 80, the flip-chip mounting can be stably executed.

When the grain size and the number of the melted solder particles are found to exceed a predetermined control criterion through the periodical measurement, it is necessary to perform maintenance for, for example, exchanging the melted resin 14 including the melted solder particles contained in the dipping bath 40.

The dipping bath 40 may be connected to a circulating apparatus 90 for circulating the melted resin 14 including the melted solder particles. The circulating apparatus 90 is connected to the dipping bath 40 through connecting pips 91 and 92, so that the melted resin 14 including the melted solder particles contained in the dipping bath 40 can flow into the circulating apparatus 90 through the connecting pipe 91 and return from the circulating apparatus 90 to the dipping bath 40 through the connecting pipe 92.

Since the circulating apparatus 90 has a larger content than the dipping bath 40, when the state of the melted resin 14 including the melted solder particles is kept constant therein, the melted resin 14 contained in the dipping bath 40 can be kept stable.

It is noted that the mounting apparatus 50 shown in FIG. 7 can be applied as a mounting apparatus for executing the bump formation method of this invention.

Embodiment 4

As a characteristic of the flip-chip mounting method of this invention, a semiconductor chip and a circuit board held with a given gap provided therebetween are dipped in a dipping bath containing a melted resin including melted solder particles, so as to make the melted solder particles self-assemble between terminals of the semiconductor chip and the circuit board for forming connectors. Therefore, the solder particles included in the melted resin should be in a melted state in the resin.

However, the solder particles included in the melted resin mutually bond with time and grow into larger solder balls naturally as described above, and therefore, control of the melted resin including the melted solder particles is indispensable for keeping the process stable.

The present applicant has proposed the flip-chip mounting method shown in FIGS. 1A through 1C as described above. This flip-chip mounting method is characterized by the convection additive 15 further included in the resin 13 including the solder particles (unmelted), and when the resin 13 is annealed to melt the solder particles, the convection additive 15 simultaneously boiled forcedly moves the melted solder particles, resulting in forming the uniform connectors 22 between the terminals.

In this case, the resin 13 including the unmelted solder particles is supplied onto the circuit board 10 as shown in FIG. 1A by a general method such as the application. Since the amount of the resin 13 supplied onto the circuit board 10 is small, however, the amount of solder particles included in the resin 13 may be varied. When the amount of solder particles is varied, if the method is applied to the mass production process, the connectors 22 formed between the terminals are varied among lots, which may cause quality variation.

In a flip-chip mounting method according to Embodiment 4, the dipping method employed in Embodiments 1 through 3 is used as a method for supplying the resin 13 including the unmelted solder particles onto the circuit board 10 in the flip-chip mounting method shown in FIGS. 1A through 1C.

FIGS. 9A through 9D are cross-sectional views for showing basic procedures in the flip-chip mounting method according to Embodiment 4 of the invention. It is noted that detailed description of procedures commonly performed in the flip-chip mounting method shown in FIGS. 2A through 2D is omitted.

Figure 9A:
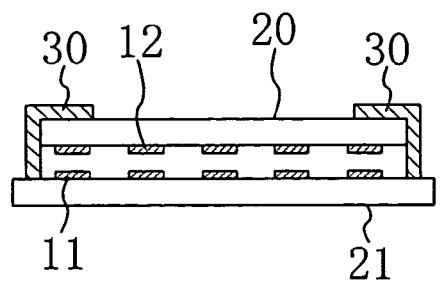
FIGS. 9A through 9D are cross-sectional views for showing procedures in a flip-chip mounting method according to Embodiment 4 of the invention.

First, as shown in FIG. 9A, a semiconductor chip 20 having a plurality of electrode terminals 12 is held by a fixing jig 30 so as to oppose a circuit board 21 having a plurality of connection terminals 11 with a given gap (of, for example, 10 through 100 μm) provided therebetween.

Figure 9B:
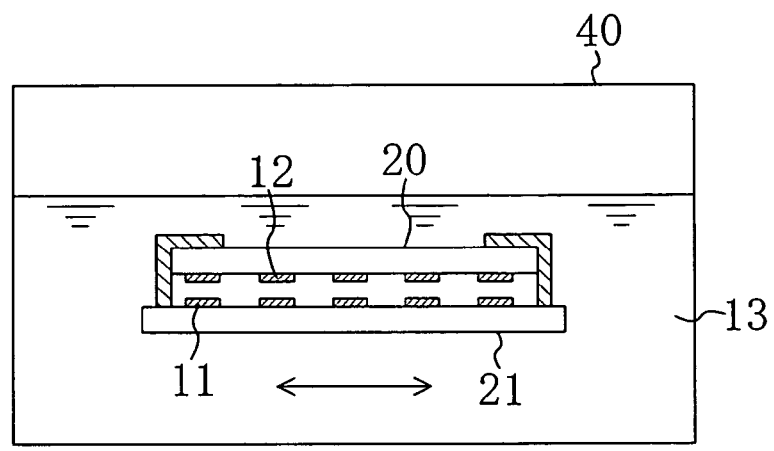

Next, as shown in FIG. 9B, the semiconductor chip 20 and the circuit board 21 held with the given gap are dipped in a dipping bath 40 containing a melted resin (such as epoxy resin) 13 including unmelted solder particles (such as Sn—Ag-based solder) and a convection additive for a given period of time. At this point, the melted resin 13 permeates into the gap between the semiconductor chip 20 and the circuit board 21, and the gap is filled with the melted resin 13.

Figure 9C:
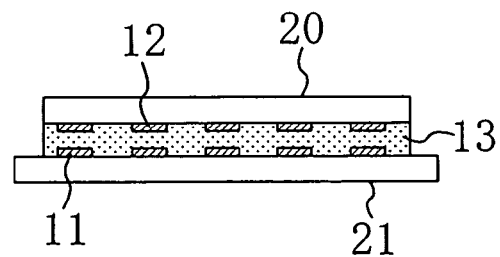
Figure 9D:
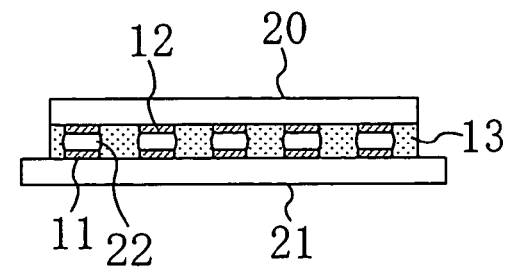

Then, as shown in FIG. 9C, the semiconductor chip 20 and the circuit board 21 are taken out of the dipping bath 40, and the melted resin 13 having permeated into the gap between the semiconductor chip 20 and the circuit board 21 is annealed. During this annealing, the solder particles are melted and the convection additive is boiled so as to convect within the resin 13. Thus, the melted solder particles self-assemble between the connection terminals 11 of the circuit board 21 and the electrode terminals 12 of the semiconductor chip 20, so as to form connectors 22 between the terminals. Thereafter, the resin 13 having permeated into the gap between the semiconductor chip 20 and the circuit board 21 is cured for fixing the semiconductor chip 20 on the circuit board 21, and thus, a flip-chip mounting body is completed.

In this case, as the convection additive, any additive that is boiled when the resin 13 is annealed at a temperature where the solder particles are melted, such as isopropyl alcohol, butyl acetate, butyl Carbitol or ethylene glycol, may be used. Alternatively, an additive that is decomposed to generate a gas at the annealing temperature for the resin 13, such as aluminum hydroxide, Dowsonite, ammonium metaborate, barium metaborate, azodicarbonamide or sodium hydrogen carbonate, may be used.

According to Embodiment 4 of the invention, the melted resin 13 contained in the dipping bath 40 is much larger in the amount than the resin 13 supplied onto the circuit board 10 in FIG. 1A, and therefore, the variation in the amount of solder particles included in the resin 13 supplied to the gap between the semiconductor chip 20 and the circuit board 21 can be suppressed by dipping them therein. Accordingly, even when the invention is applied to the mass production process, the variation in the connectors 22 formed between the terminals can be suppressed, and flip-chip mounting bodies with stable quality can be provided.

It is noted that the flip-chip mounting method of Embodiment 4 of the invention can be directly applied to a bump formation method.

FIGS. 10A through 10E are cross-sectional views for showing basic procedures in a bump formation method according to Embodiment 4 of the invention. The basic procedures are the same as those in the flip-chip mounting method shown in FIGS. 9A through 9D and hence detailed description is omitted.

First, as shown in FIG. 1A, a flat plate 26 is held by a fixing jig 30 in a position to oppose a substrate 25 having a plurality of electrodes 27 with a given gap provided therebetween.

Figure 10A:
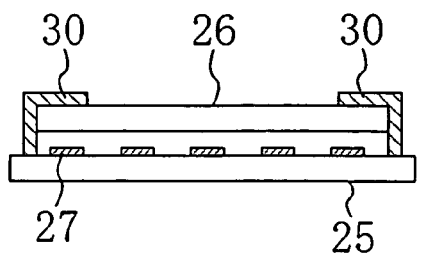
FIGS. 10A through 10E are cross-sectional views for showing procedures in a bump formation method according to Embodiment 4 of the invention.
Figure 10B:
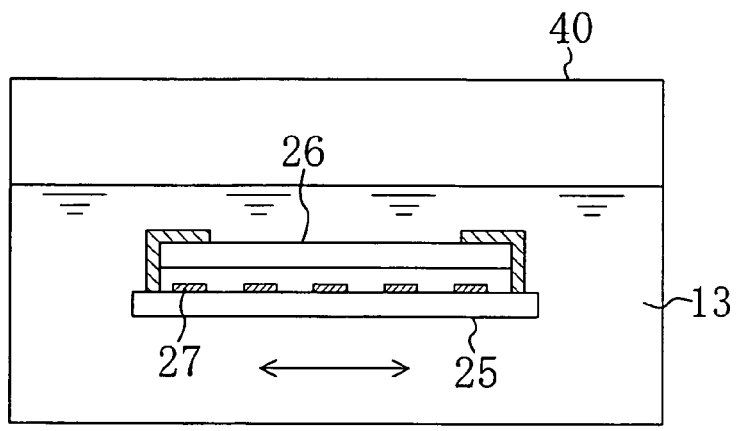

Next, as shown in FIG. 10B, the substrate 25 and the flat plate 26 held with the given gap are dipped in a dipping bath 40 containing a melted resin 13 including solder particles and a convection additive for a given period of time. At this point, the melted resin 13 permeates into the gap between the substrate 25 and the flat plate 26, and the gap is filled with the melted resin 13.

Figure 10C:
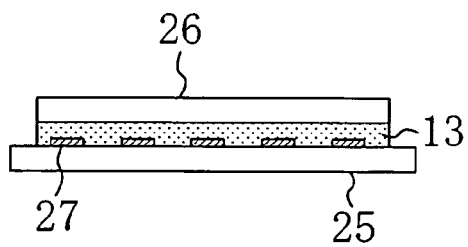
Figure 10D:
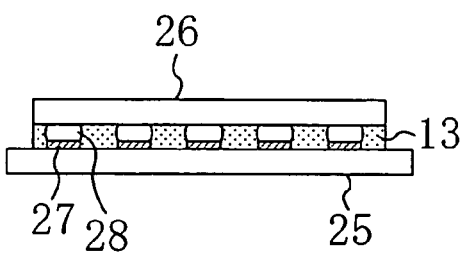

Then, as shown in FIG. 10C, the substrate 25 and the flat plate 26 are taken out of the dipping bath 40, and the melted resin 13 having permeated into the gap between the substrate 25 and the flat plate 26 is annealed. During this annealing, the solder particles are melted, and the convection additive is boiled to convect within the melted resin 13, and therefore, the melted solder particles self-assemble on the electrodes 27 of the substrate 25 so as to form bumps 28 as shown in FIG. 10D.

Figure 10E:
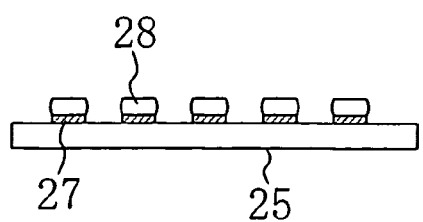

Thereafter, as shown in FIG. 10E, the melted resin 13 having permeated into the gap between the substrate 25 and the flat plate 26 and the flat plate 26 are removed, so as to complete the substrate 25 including the bumps formed on the electrodes 27.

As described so far, according to the flip-chip mounting method and the bump formation method of this invention, a semiconductor chip and a circuit board (a substrate and a flat plate) held with a given gap provided therebetween are dipped in a dipping bath containing a melted resin including melted solder particles, so as to constantly supply the melted solder particles dispersed in the melted resin to the gap between the semiconductor chip and the circuit board (between the substrate and the flat plate), and therefore, bond of the melted solder particles is uniformly proceeded in the gap. As a result, the melted solder particles uniformly grown self-assemble between connection terminals of the circuit board and electrode terminals of the semiconductor chip (on electrodes of the substrate) with high wettability, so as to uniformly form connectors (bumps provided on the electrodes) for electrically connecting the electrode terminals and the connection terminals to each other.

Furthermore, when the semiconductor chip and the circuit board (the substrate and the flat plate) held with the given gap are dipped in the dipping bath while being rocked or dipped in the dipping bath while allowing the melted resin to flow, the melted solder particles dispersed in the melted resin are more forcedly supplied to the gap between the semiconductor chip and the circuit board (between the substrate and the flat plate), and hence, the bond of the melted solder particles is more uniformly proceeded. As a result, the connectors (the bumps) can be more uniformly formed between the electrode terminals and the connection terminals (on the electrodes of the substrate). In addition, since the melted solder particles dispersed in the melted resin can be more efficiently incorporated into the gap, the ratio of the melted solder particles included in the melted resin can be set to be smaller, and hence, the dipping bath can be more easily controlled.

In conventional mounting of a component such as an IC on a printed board, a flow solder bath is used. However, merely solder in a melted state is contained in the solder bath, which is completely different from the melted resin including the melted solder particles used in this invention. Also, the flow solder bath is used for soldering a component inserted and mounted on a printed board, and the object and the structure are completely different from those of the flip-chip mounting and the bump formation of this invention.

Although the present invention has been described by way of preferred embodiments, the present invention is not limited to the description but can be variously modified.

INDUSTRIAL APPLICABILITY

The present invention can provide a flip-chip mounting method and a bump formation method applicable to flip-chip mounting of a next generation LSI and having high productivity and high reliability.

The invention claimed is:

1. A flip-chip mounting method in which a semiconductor chip having a plurality of electrode terminals is aligned to oppose a circuit board having a plurality of connection terminals for electrically connecting said connection terminals of said circuit board and said electrode terminals of said semiconductor chip to each other, comprising the steps of:
holding said semiconductor chip to oppose said circuit board with a given gap provided therebetween;
dipping said semiconductor chip and said circuit board held with the given gap in a dipping bath containing a melted resin including melted solder particles; and
after the step of dipping, taking said conductor chip and said circuit board out of said dipping bath and curing said melted resin having permeated into the gap between said semiconductor chip and said circuit board,
wherein in the step of dipping, said melted solder particles self-assemble between said connection terminals of said circuit board and said electrode terminals of said semiconductor chip, whereby forming connectors between said terminals, and
the step of dipping is performed while rocking said semiconductor chip and said circuit board held with the given gap within said dipping bath.

2. The flip-chip mounting method of claim 1, wherein in the step of holding said semiconductor chip, said semiconductor chip is held to oppose said circuit board with the given gap provided therebetween by holding said semiconductor chip and said circuit board with a fixing jig.

3. The flip-chip mounting method of claim 2, wherein the step of holding said semiconductor chip includes a step of holding a plurality of semiconductor chips and a plurality of circuit boards with said fixing jig, whereby holding each of said semiconductor chips to oppose each of said circuit boards with a given gap provided therebetween, and
the step of dipping is performed as batch processing for dipping said plurality of semiconductor chips and said plurality of circuit boards simultaneously in said dipping bath.

4. The flip-chip mounting method of claim 1, wherein the step of dipping is performed with a pressure in said dipping bath reduced.

5. The flip-chip mounting method of claim 1, wherein the step of dipping is performed in a dipping bath in which said melted resin has a temperature gradient, and
said solder particles included in said melted resin are kept in an unmelted state in a low temperature region and are kept in a melted state in a high temperature region, and said semiconductor chip and said circuit board held with the given gap are dipped in the low temperature region of said dipping bath for a given period of time before being dipped in the high temperature region for a given period of time.

6. A flip-chip mounting method in which a circuit board having a plurality of connection terminals is aligned to oppose a semiconductor chip having a plurality of electrode terminals for electrically connecting said connection terminals of said circuit board and said electrode terminals of said semiconductor chip to each other, comprising the steps of:
holding said semiconductor chip to oppose said circuit board with a given gap provided therebetween;
dipping said semiconductor chip and said circuit board held with the given gap in a dipping bath containing a melted resin including solder particles and a convection additive for a given period of time; and
annealing said melted resin having permeated into the gap between said semiconductor chip and said circuit board after taking said semiconductor chip and said circuit board out of said dipping bath,
wherein in the step of annealing, said solder particles are melted and said convection additive is boiled to convect within said melted resin for making said melted solder particles self-assemble between said connection terminals of said circuit board and said electrode terminals of said semiconductor chip, whereby forming connectors between said terminals.

7. The flip-chip mounting method of claim 6, further comprising, after the step of annealing, a step of fixing said semiconductor chip on said circuit board by curing said melted resin having permeated into the gap between said semiconductor chip and said circuit board.

8. A flip-chip method in which a semiconductor chip having a plurality of electrode terminals is aligned to oppose a circuit board having a plurality of connection terminals for electrically connecting said connection terminals of said circuit board and said electrode terminals of said semiconductor chip to each other, the method comprising steps of:
   (a) holding said semiconductor chip to oppose said circuit board with a given gap provided therebetween;
   (b) dipping said semiconductor chip and said circuit board held with the given gap in a dipping bath containing a melted resin including melted solder particles wherein in the step of dipping, said melted solder particles self-assemble between said connection terminals of said circuit board and said electrode terminals of said semiconductor chip, whereby forming connectors between said terminals, and
   the step of dipping is performed in said dipping bath while said melted resin is flowing in said dipping bath; and
   (c) after the step of dipping, taking said semiconductor chip and said circuit board out of said dipping bath and curing said melting resin having permeated into the gap between said semiconductor chip and said circuit board.

* * * * *

UNITED STATES PATENT AND TRADEMARK OFFICE
CERTIFICATE OF CORRECTION

PATENT NO. : 7,927,997 B2
APPLICATION NO. : 11/579299
DATED : April 19, 2011
INVENTOR(S) : Koichi Hirano et al.

It is certified that error appears in the above-identified patent and that said Letters Patent is hereby corrected as shown below:

Page 2, line 2, In Item "(56) References Cited" under "Foreign Patent Documents," please delete "JP05-1881155" and add --Japanese Patent Application No. 05-181155--.

Signed and Sealed this
Twentieth Day of September, 2011

David J. Kappos
*Director of the United States Patent and Trademark Office*